United States Patent
Matsumoto et al.

(10) Patent No.: US 6,593,219 B2
(45) Date of Patent: Jul. 15, 2003

(54) METHOD FOR FABRICATING ELECTRODE STRUCTURE AND METHOD FOR FABRICATING SEMICONDUCTOR DEVICE

(75) Inventors: Michikazu Matsumoto, Uji (JP); Naohisa Sengoku, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/916,447

(22) Filed: Jul. 30, 2001

(65) Prior Publication Data

US 2002/0048636 A1 Apr. 25, 2002

(30) Foreign Application Priority Data

Aug. 2, 2000 (JP) .................... 2000-233928

(51) Int. Cl.⁷ .................. H01L 21/3205; H01L 21/4763
(52) U.S. Cl. ............ 438/592; 438/582; 438/583; 438/592; 438/648; 438/649; 438/655; 438/656; 438/664; 438/682; 438/683
(58) Field of Search ................. 438/664, 683, 438/682, 583, 582, 648, 649, 655, 656, 592

(56) References Cited

U.S. PATENT DOCUMENTS

| | | | | |
|---|---|---|---|---|
| 5,358,899 A | * | 10/1994 | Fleischman et al. | 438/605 |
| 5,780,361 A | * | 7/1998 | Inoue | 438/683 |
| 6,001,729 A | * | 12/1999 | Shinriki et al. | 438/625 |
| 6,071,782 A | * | 6/2000 | Maa et al. | 438/301 |
| 6,255,204 B1 | * | 7/2001 | Tobin et al. | 438/592 |
| 6,303,483 B1 | * | 10/2001 | Kunikiyo | 438/592 |
| 6,306,743 B1 | * | 10/2001 | Lee | 438/592 |
| 6,335,241 B1 | * | 1/2002 | Hieda et al. | 438/253 |
| 6,337,249 B1 | * | 1/2002 | Yamane et al. | 438/279 |
| 6,339,245 B1 | * | 1/2002 | Maa et al. | 257/382 |
| 6,352,891 B1 | * | 3/2002 | Kasai | 438/241 |
| 6,387,500 B1 | * | 5/2002 | Behl | 428/404 |
| 2002/0006674 A1 | * | 1/2002 | Ma et al. | 438/3 |

FOREIGN PATENT DOCUMENTS

| | | |
|---|---|---|
| JP | 07-235542 | 9/1995 |
| JP | 07-273066 | 10/1995 |
| JP | 11-068095 | 3/1999 |
| JP | 11-261059 | 9/1999 |
| JP | 2000-068502 | 3/2000 |

\* cited by examiner

*Primary Examiner*—Amir Zarabian
*Assistant Examiner*—Ida M. Soward
(74) *Attorney, Agent, or Firm*—Nixon Peabody LLP; Donald R. Studebaker

(57) ABSTRACT

A first metal film of a first metal is deposited on a silicon-containing film containing silicon as a principal constituent, and a second metal film of a nitride of a second metal is deposited on the first metal film. Thereafter, a metal film with a high melting point is deposited on the second metal film, so as to form a multi-layer film of the silicon-containing film, the first metal film, the second metal film and the metal film with a high melting point. The multi-layer film is then subjected to annealing at a temperature of 750° C. or more. In this case, the first metal is nitrided to be changed into a nitride of the first metal and a silicide layer of the first metal is not formed in a surface portion of the silicon-containing film before the annealing.

12 Claims, 11 Drawing Sheets

METHOD FOR FABRICATING ELECTRODE STRUCTURE AND METHOD FOR FABRICATING SEMICONDUCTOR DEVICE

BACKGROUND OF THE INVENTION

The present invention relates to a method for fabricating an electrode structure including a lower film of polysilicon or amorphous silicon and an upper film of a metal with a high melting point, and a method for fabricating a semiconductor device including the electrode structure as a gate electrode.

In a conventional MOS transistor, the gate electrode is formed from a polysilicon film. In accordance with refinement and increase in operation speed of LSIS, there are increasing demands for lowering resistance of a gate electrode of a MOS transistor.

For the purpose of lowering the resistance of a gate electrode, technique to use, as a gate electrode, a polymetal gate electrode of a multi-layer film including a lower polysilicon film and an upper metal film with a high melting point is proposed, and a tungsten film is proposed for use as the upper metal film with a high melting point. When a tungsten film is used as the upper metal film with a high melting point, the resistance of the gate electrode can be lowered.

It is necessary to form, between the polysilicon film and the tungsten film, a barrier film of tungsten nitride ($WN_x$) or titanium nitride (TiN) for preventing a dopant (such as B, P and As) introduced into the polysilicon film from diffusing into the tungsten film (as described in, for example, Japanese Laid-Open Patent Publication Nos. 11-261059 and 7-235542).

FIG. 8A shows the cross-sectional structure of an electrode structure according to a first conventional example. As shown in FIG. 8A, a gate electrode is formed above a semiconductor substrate 1 with a gate insulating film 2 sandwiched therebetween, and the gate electrode is composed of a polysilicon film 3, a barrier film 4A of tungsten nitride ($WN_x$) and a tungsten film 5 successively formed in this order in the upward direction.

FIG. 8B shows the cross-sectional structure of an electrode structure according to a second conventional example. As shown in FIG. 8B, a gate electrode is formed above a semiconductor substrate 1 with a gate insulating film 2 sandwiched therebetween, and the gate electrode is composed of a polysilicon film 3, a barrier film 4B of titanium nitride (TiN) and a tungsten film 5 successively formed in this order in the upward direction.

In the electrode structure of the first conventional example, when annealing is carried out in a subsequent procedure, nitrogen included in the barrier film 4A of tungsten nitride is evaporated, so that the barrier film 4A can be changed into the tungsten film 5. In addition, nitrogen included in the barrier film 4A is reacted with silicon included in the polysilicon film 3, so that a reaction layer 6 of silicon nitride (SiN) with very high resistance can be formed between the polysilicon film 3 and the tungsten film 5 as shown in FIG. 8C. As a result, the resistance of the gate electrode is disadvantageously increased.

As a countermeasure, Japanese Laid-Open Patent Publication No. 7-235542 describes that the sheet resistance of the reaction layer 6 can be lowered so as to lower the resistance of the gate electrode by setting the surface density of nitrogen included in the reaction layer 6 of silicon nitride to a predetermined value or less.

The present inventors, however, have found that the resistance of the gate electrode cannot be lowered even when the surface density of nitrogen included in the reaction layer 6 is set to the predetermined value or less in the electrode structure of the first conventional example.

Therefore, the present inventors have variously examined why the resistance of the gate electrode cannot be lowered in the electrode structure of the first conventional example, resulting in finding the following: When the thickness of the barrier film 4A is reduced to approximately 0.1 through 1.0 nm for lowering the surface density of nitrogen included in the reaction layer 6, the barrier film 4A cannot exhibit the barrier function and tungsten silicide ($WSi_x$) is formed, and hence, the resistance of the gate electrode cannot be lowered. On the other hand, when the thickness of the barrier film 4A is larger than 1.0 nm, although the barrier function can be exhibited, the reaction layer 6 of silicon nitride with very high resistance is formed between the polysilicon film 3 and the tungsten film 5. Therefore, the interface resistance between the polysilicon film 3 and the tungsten film 5 is increased.

Furthermore, since the tungsten nitride film has poor heat resistance, a large amount of nitrogen included in the tungsten nitride film is diffused through annealing carried out at 750° C. or more, so as to change the tungsten nitride film into a tungsten film.

In the case where the barrier film of titanium nitride is used as in the electrode structure of the second conventional example, a reaction layer 6 of silicon nitride with very high resistance is formed between the polysilicon film and the tungsten film. Therefore, the interface resistance between the polysilicon film 3 and the tungsten film 5 is increased.

As shown in FIG. 9A, a polysilicon film 3 is formed above a semiconductor substrate 1 with a gate insulating film 2 sandwiched therebetween, and the polysilicon film 3 is doped with a p-type dopant such as boron in forming a p-type gate electrode and with an n-type dopant such as phosphorus in forming an n-type gate electrode. In order to deposit a titanium nitride film 4B on the polysilicon film 3, the semiconductor substrate 1 is placed in a chamber in which a titanium target 7 including titanium as a principal constituent is disposed. Then, a mixed gas of an argon gas and a nitrogen gas is introduced into the chamber and discharge is caused in the chamber. In this manner, plasma is generated from the argon gas and the nitrogen gas, and nitrogen ions included in the plasma are reacted with silicon included in the polysilicon film 3, so that a reaction layer 6 of silicon nitride can be formed in a surface portion of the polysilicon film 3. The titanium target 7 is also nitrided so as to form a titanium nitride film 8 thereon, and titanium nitride is sputtered out from the titanium nitride film 8 so as to form a barrier film 4B of titanium nitride on the reaction layer 6 as shown in FIG. 9B.

Then, the semiconductor substrate 1 is placed in a chamber in which a tungsten target 9 including tungsten as a principal constituent is disposed, an argon gas is introduced into the chamber and discharge is caused in the chamber. In this manner, plasma is generated from the argon gas, and tungsten is sputtered out from the tungsten target 9 by argon ions included in the plasma, so that the sputtered tungsten can be deposited on the titanium nitride film 4B. As a result, a tungsten film 5 is formed on the titanium nitride film 4B as shown in FIG. 9C.

Next, dopant layers serving as a source and a drain of the MOS transistor are formed in the semiconductor substrate 1, and annealing is carried out at 750° C. or more for activating the dopant layers. Thus, excessive nitrogen included in the barrier film 4B is diffused into an upper portion of the polysilicon film 3 as shown in FIG. 10A. As a result, the thickness of the reaction layer 6 of titanium nitride is increased as shown in FIG. 10B.

Also, the present inventors have examined the relationship between the annealing temperature and the interface resistance of the barrier film obtained after the annealing. FIG. 11 shows the relationship between the annealing temperature (° C.) and the interface resistance ($R_c$) between the polysilicon film and the metal film with a high melting point obtained after the annealing. In FIG. 11, the relationship obtained when a barrier film of tungsten nitride ($WN_x$) is formed on an n-type polysilicon film (expressed as NPS) is plotted with ●, the relationship obtained when a barrier film of tungsten nitride is formed on a p-type polysilicon film (expressed as PPS) is plotted with ○, the relationship obtained when a barrier film of titanium nitride (TiN) is formed on an n-type polysilicon film is plotted with ♦, and the relationship obtained when a barrier film of titanium nitride is formed on a p-type polysilicon film is plotted with ◇. Also, in FIG. 11, since the contact between the films is non-ohmic, the interface resistance is shown as a resistance value obtained by allowing a current of 1 mA/$\mu m^2$ to flow.

It is understood from FIG. 11 that the interface resistance is high in using the barrier film 4B of titanium nitride even when the annealing is carried out at a low temperature. Also, as a result of experiments made by the present inventors, it is found that the interface resistance is high in using the barrier film 4B of titanium nitride even when the annealing is not carried out. This is because the reaction layer 6 is formed between the polysilicon film 3 and the barrier film 4B as shown in FIGS. 9A through 9C.

Furthermore, in using the barrier film 4A of tungsten nitride, although the interface resistance is lower than in using the barrier film 4B of titanium nitride, the interface resistance is abruptly increased when the annealing is carried out at 750° C. or more. This is because in using the barrier film 4A of tungsten nitride, nitrogen included in the tungsten nitride is diffused through the annealing carried out at 750° C. or more, so as to form the reaction layer 6 of silicon nitride between the polysilicon film 3 and the tungsten film 5.

When the interface resistance ($R_c$) between the polysilicon film 3 and the tungsten film 5 is high, the operation speed of the MOS transistor is lowered. Specifically, when the gate electrode is operated with AC (alternating current), distributed capacitance generated in the gate insulating film is repeatedly charged and discharged. Therefore, a current flows through distributed interface resistance, and hence, the influence of the distributed interface resistance is exhibited, which lowers the operation speed of the MOS transistor. When the operation speed of the MOS transistor is lowered, the operation speed of the entire LSI is lowered, so as to disadvantageously increase signal delay time. Since the operation speed of an LSI is regarded to be the most significant today, the lowering of the operation speed of the MOS transistor by merely several % becomes a serious problem.

In order to lower the interface resistance so as not to affect the delay time of the MOS transistor, interface resistance of 300 $\Omega\mu m^2$ or less should be attained.

SUMMARY OF THE INVENTION

In consideration of the aforementioned conventional disadvantages, an object of the invention is lowering interface resistance between a polysilicon film and a metal film with a high melting point.

In order to achieve the object, the method for fabricating an electrode structure of this invention comprises the steps of depositing a first metal film of a first metal on a silicon-containing film containing silicon as a principal constituent; depositing a second metal film of a nitride of a second metal on the first metal film; depositing a metal film with a high melting point on the second metal film, whereby forming a multi-layer film of the silicon-containing film, the first metal film, the second metal film and the metal film with a high melting point; and carrying out annealing on the multi-layer film at a temperature of 750° C. or more, and the first metal is nitrided to be changed into a nitride of the first metal before the annealing, and a silicide layer of the first metal is not formed in a surface portion of the silicon-containing film before the annealing.

In the method for fabricating an electrode structure of this invention, a barrier film composed of the lower first metal film of the first metal and the upper second metal film of the nitride of the second metal is disposed between the silicon-containing film and the metal film with a high melting point. Furthermore, the first metal is changed into the nitride of the first metal and a silicide layer of the first metal is not formed in a surface portion of the silicon-containing film before the annealing. Therefore, the interface resistance between the silicon-containing film and the metal film with a high melting point is largely lowered for the following reason: Nitrogen included in the second metal film is consumed in nitriding the first metal film, and merely a small amount of nitrogen included in the second metal film is used for nitriding the silicon-containing film. Accordingly, a reaction layer of a silicon nitride film formed between the silicon-containing film and the metal nitride film and having very high resistance can be reduced in its thickness, which lowers the interface resistance.

In the method for fabricating an electrode structure, no silicon nitride film or a silicon nitride film with a thickness of 1.5 nm or less is preferably formed between the silicon-containing film and the first metal film as a result of the annealing.

In this manner, the interface resistance between the silicon-containing film and the metal film with a high melting point can be suppressed to 300 $\Omega\mu m^2$ or less. Therefore, the delay time of a MOS transistor including a gate electrode composed of the electrode structure of this invention can be largely reduced.

In the method for fabricating an electrode structure, interface resistance between the silicon-containing film and the metal film with a high melting point is preferably 300 $\Omega\mu m^2$ or less after the annealing.

In this manner, the delay time of a MOS transistor including a gate electrode composed of the electrode structure of this invention can be largely reduced.

In the method for fabricating an electrode structure, it is preferred that the first metal and the second metal are the same metal, that the first metal film is deposited through sputtering carried out by using a target including the same metal, and that the second metal film is deposited by sputtering a nitride film of the same metal formed in a surface portion of the target.

In this manner, the first metal film and the second metal film can be continuously deposited by using the target of the same metal with merely an introduced gas changed, resulting in improving the throughput.

In the method for fabricating an electrode structure, the first metal and the second metal are preferably both titanium.

In the method for fabricating an electrode structure, the nitride of the second metal can be titanium nitride, tungsten nitride, tantalum nitride or tungsten silicide nitride.

In order to achieve the object, the method for fabricating a semiconductor device of this invention comprises the steps of depositing a polysilicon film on a semiconductor region; depositing a first metal film of a first metal on the polysilicon film; depositing a second metal film of a nitride of a second metal on the first metal film; depositing a metal film with a high melting point on the second metal film, whereby forming a gate electrode including the polysilicon film, the first metal film, the second metal film and the metal film with a high melting point; forming dopant layers serving as a source and a drain by ion implanting a dopant with the gate electrode used as a mask; and activating the dopant layers by carrying out annealing at a temperature of 750° C. or more, and the first metal is nitrided to be changed into a nitride of the first metal before the annealing, and a silicide layer of the first metal is not formed in a surface portion of the polysilicon film before the annealing.

In the method for fabricating a semiconductor device of this invention, a semiconductor device is fabricated by employing the method for fabricating an electrode structure of this invention. Therefore, even when the annealing at 750° C. or more is carried out for activating the dopant layers serving as the source and the drain, the interface resistance between the polysilicon film and the metal film with a high melting point included in the gate electrode can be very low.

Accordingly, the delay time of the MOS transistor can be reduced so as to improve the operation speed of the MOS transistor.

In the method for fabricating a semiconductor device, no silicon nitride film or a silicon nitride film with a thickness of 1.5 nm or less is preferably formed between the polysilicon film and the first metal film as a result of the annealing.

In this manner, the delay time of the MOS transistor can be largely reduced.

In the method for fabricating a semiconductor device, the first metal and the second metal are preferably both titanium.

DETAILED DESCRIPTION OF THE INVENTION

Embodiment 1

As a method for fabricating an electrode structure according to Embodiment 1 of the invention, a method for forming a gate electrode will now be described with reference to FIGS. 1A through 1C and 2A through 2C.

Figure 1A:
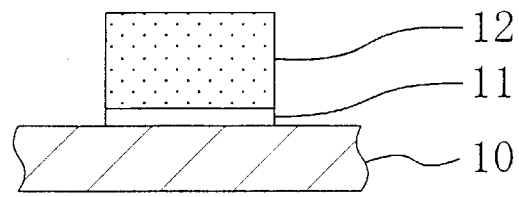
FIGS. 1A, 1B and 1C are cross-sectional views for showing procedures in a method for fabricating an electrode structure according to Embodiment 1 of the invention.

First, as shown in FIG. 1A, a gate insulating film 11 of a silicon oxide film is formed on a silicon substrate 10, and a polysilicon film 12 serving as a lower film of the gate electrode is deposited on the gate insulating film 11. Thereafter, in forming p-type polysilicon, the polysilicon film 12 is doped with a p-type dopant such as boron, and in forming n-type polysilicon, the polysilicon film 12 is doped with an n-type dopant such as phosphorus. The polysilicon film 12 may be replaced with an amorphous silicon film.

Figure 1B:
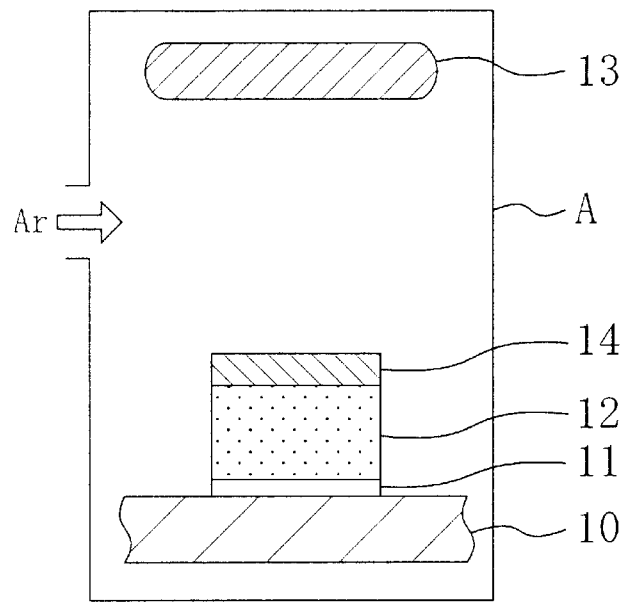

Next, as shown in FIG. 1B, after the semiconductor substrate 10 is placed in a chamber A in which a titanium target 13 including titanium as a principal constituent is disposed, an argon gas is introduced into the chamber A and discharge is caused in the chamber A. In this manner, plasma is generated from the argon gas, and the titanium target 13 is sputtered by argon ions included in the plasma, so that a titanium film 14 serving as a first metal film can be deposited on the polysilicon film 12. The thickness of the titanium film 14 will be described in detail below and is, for example, approximately 4.5 nm.

Figure 1C:
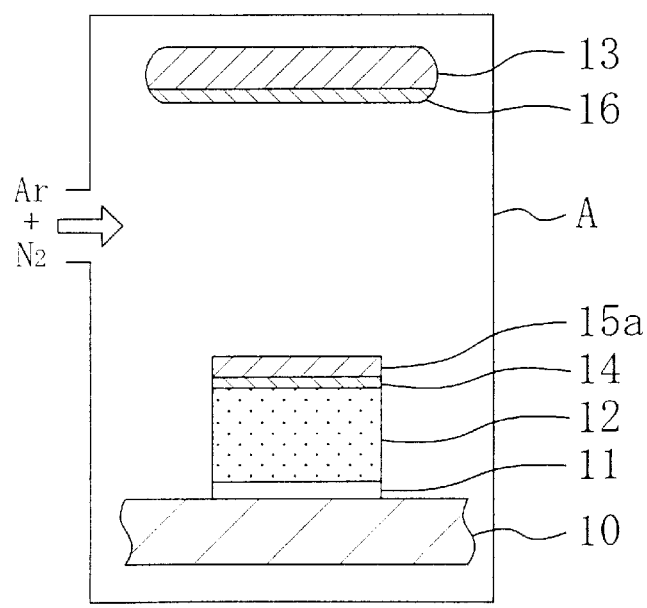

Then, as shown in FIG. 1C, a mixed gas of an argon gas and a nitrogen gas is introduced into the chamber A and discharge is caused in the chamber A, so as to generate plasma from the argon gas and the nitrogen gas. In this manner, the titanium film 14 is nitrided so as to form a first titanium nitride film 15a in a surface portion of the titanium film 14, and the titanium target 13 is also nitrided so as to form a titanium nitride film 16 in a surface portion of the titanium target 13.

Figure 2A:
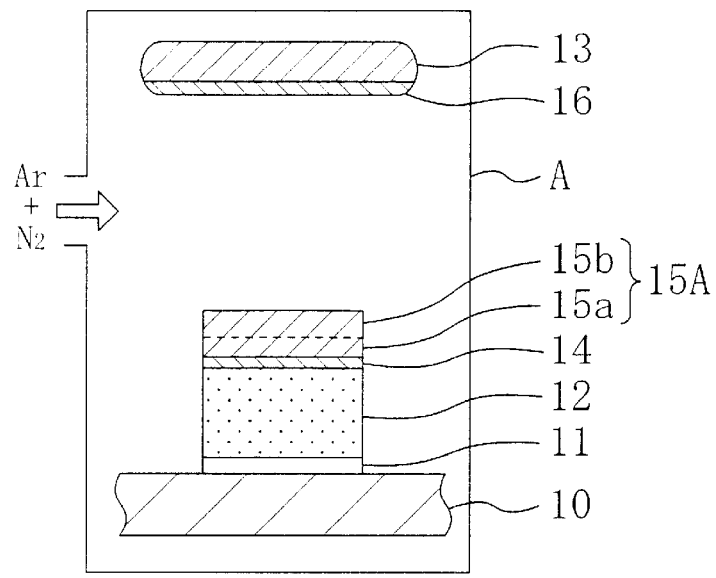
FIGS. 2A, 2B and 2C are cross-sectional views for showing other procedures in the method for fabricating an electrode structure of Embodiment 1.

Subsequently, as shown in FIG. 2A, the mixed gas of the argon gas and the nitrogen gas is continuously introduced and the discharge is continuously caused in the chamber A. Thus, the titanium nitride film 16 in the surface portion of the titanium target 13 is sputtered by the argon ions, so as to deposit a second titanium nitride film 15b on the first titanium nitride film 15a. Thus, a titanium nitride film 15A including the first titanium nitride film 15a and the second titanium nitride film 15b is formed as a second metal film. The titanium film 14 (namely, the first metal film) and the titanium nitride film 15A (namely, the second metal film) together form a barrier film.

In Embodiment 1, the titanium film 14 can be deposited on the polysilicon film 12 by introducing the argon gas first into the chamber A containing the titanium target 13, and thereafter, the titanium nitride film 15A can be formed on the titanium film 14 by introducing the mixed gas of the argon gas and the nitrogen gas. In other words, the titanium film 14 and the titanium nitride film 15A can be continuously formed by merely changing the gas introduced into the chamber A without replacing the titanium target 13.

Figure 2B:
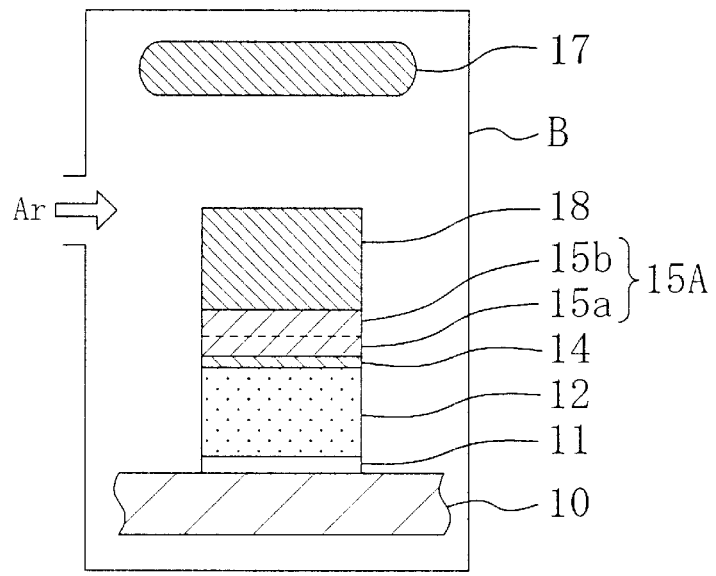
Figure 2C:
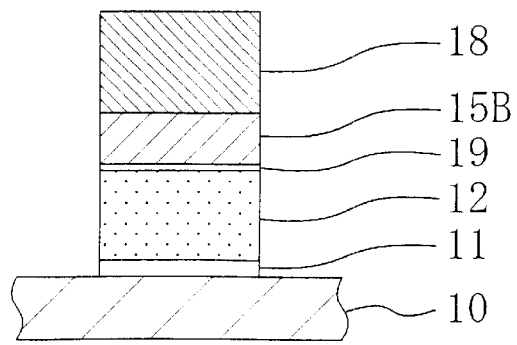

Next, as shown in FIG. 2B, after the semiconductor substrate 10 is placed in a chamber B in which a tungsten target 17 including tungsten as a principal constituent is disposed, an argon gas is introduced into the chamber B and discharge is caused in the chamber B. In this manner, plasma is generated from the argon gas, and the tungsten target 17 is sputtered by argon ions included in the plasma, so as to deposit a tungsten film 18 serving as a metal film with a high melting point on the titanium nitride film 15A. The polysilicon film 12, the titanium film 14, the titanium nitride film 15A and the tungsten film 18 together form the gate electrode corresponding to the electrode structure of this embodiment.

In forming a gate electrode, a hard mask (SiN film) or a sidewall (SiN film) is deposited before forming a source and a drain, and annealing is carried out at approximately 650 through 750° C. in depositing such a film. In this annealing carried out before forming the source and the drain, nitrogen included in the titanium nitride film 15A is diffused into the titanium film 14 and the polysilicon film 12. At this point, owing to the diffusion of nitrogen into the titanium film 14, the titanium film 14 is changed into a titanium nitride film. Therefore, the titanium film 14 is disappeared, and the titanium nitride film changed from the titanium film 14 and the previously formed titanium nitride film 15A together form a titanium nitride film 15B. Also, owing to the diffusion of nitrogen into the polysilicon film 12, a reaction layer 19 including silicon and nitrogen as principal constituents is formed on the interface between the polysilicon film 12 and the titanium nitride film 15B. The reaction layer 19 may include other atoms such as oxygen atoms.

Thereafter, the semiconductor substrate 10 is doped with a dopant by using the gate electrode as a mask so as to form dopant layers serving as the source and the drain, and annealing is carried out, for example, at 750° C. or more for activating the dopant. During the annealing carried out at 750° C. or more for activating the dopant, the reaction layer 19 is not enlarged because there is little excessive (diffusible) nitrogen remaining in the titanium nitride film 15B.

As described above, since the reaction layer 19 including silicon and nitrogen as the principal constituents has very high resistance, the interface resistance between the polysilicon film 12 and the tungsten film 18 is high when the reaction layer 19 has a large thickness.

In Embodiment 1, however, since the titanium film 14 is disposed between the polysilicon film 12 and the titanium nitride film 15A, most of nitrogen included in the titanium nitride film 15A is consumed in nitriding the titanium film 14 with merely little nitrogen consumed in nitriding the polysilicon film 12. Therefore, the thickness of the reaction layer 19 is much smaller than that of the conventional reaction layer. Accordingly, the interface resistance between the polysilicon film 12 and the tungsten film 18 can be largely lowered as compared with that obtained in the conventional technique.

Accordingly, the titanium film 14 preferably has such a thickness that the entire titanium film 14 is changed into the titanium nitride film through the diffusion of nitrogen of the titanium nitride film 15A into the titanium film 14.

In the case where the thickness of the titanium film 14 is so large that the entire titanium film 14 cannot be changed into the titanium nitride film, titanium included in the titanium film 14 and silicon included in the polysilicon film 12 are reacted with each other so as to form a titanium silicide ($TiSi_2$) layer in a surface portion of the polysilicon film 12 through the annealing carried out before the annealing for activating the source and the drain. Therefore, peeling is caused in the annealing carried out at 750° C. or more for activating the source and the drain.

On the other hand, in the case where the thickness of the titanium film 14 is too small, although the titanium silicide layer is not formed, a large amount of nitrogen included in the titanium nitride film 15A pass through the titanium film 14 to diffuse into the polysilicon film 12. Therefore, the reaction layer 19 attains a large thickness, which increases the interface resistance between the polysilicon film 12 and the metal film 18 with a high melting point.

As described above, in order to lower the interface resistance between the polysilicon film 12 and the metal film 18 with a high melting point so as not to affect the delay time of a MOS transistor, interface resistance of 300 $\Omega\mu m^2$ or less should be attained.

Also, in order to attain the interface resistance of 300 $\Omega\mu m^2$ or less between the polysilicon film 12 and the metal film 18 with a high melting point, the reaction layer 19 of silicon nitride preferably has a thickness for causing an ohmic characteristic between the polysilicon film 12 and the titanium nitride film 15B, namely, a thickness of 0 through 1.5 nm, and more preferably a thickness of 0 through 1.0 nm.

The reaction layer 19 having a thickness of 0 nm means that the reaction layer 19 is substantially not formed. When the reaction layer 19 has a thickness of 0 nm, the resistance of the reaction layer 19 is not present, and hence, the interface resistance between the polysilicon film 12 and the metal film 18 with a high melting point can be further lowered.

In Embodiment 1, the surface portion of the titanium film 14 is nitrided by the plasma of the nitrogen gas, and the titanium film 14 is changed into the titanium nitride film by diffusing nitrogen included in the titanium nitride film 15A into the titanium film 14 through the annealing subsequently carried out. Instead, the entire titanium film 14 may be nitrided by the plasma of the nitrogen gas so as to be changed into the titanium nitride film. Also in this case, the growth of the reaction layer of silicon nitride formed through the reaction between silicon and nitride can be suppressed as compared with the case where the titanium film 14 is not deposited, and therefore, the interface resistance between the polysilicon film and the metal film with a high melting point can be lowered.

Characteristic of Electrode Structure of Embodiment 1

Now, the characteristic of the gate electrode having a polymetal structure fabricated by the method of Embodiment 1 will be described.

Figure 3:
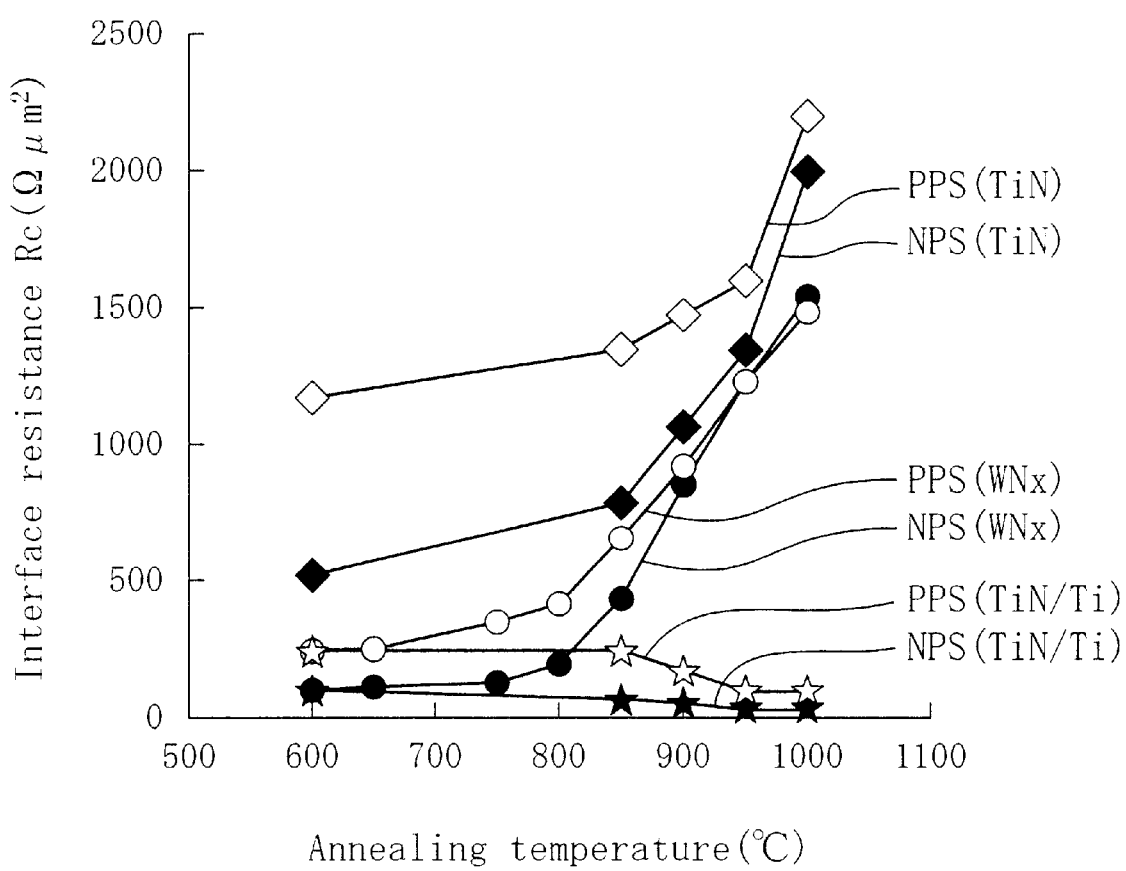
FIG. 3 is a graph for showing the relationship between the annealing temperature and interface resistance obtained after annealing carried out on a gate electrode composed of the electrode structure of Embodiment 1 or an electrode structure of a first or second conventional example.

FIG. 3 shows the relationship between the annealing temperature (° C.) and the interface resistance between a polysilicon film and a metal film with a high melting point obtained after carrying out annealing on a gate electrode fabricated by using the electrode structure of Embodiment 1 or the electrode structure of the first or second conventional example. In FIG. 3, the relationship obtained in a gate electrode of Embodiment 1 (namely, a gate electrode including a barrier film of a titanium film and a titanium nitride film formed on an n-type polysilicon film (expressed as NPS)) is plotted with ★, the relationship obtained in another gate electrode of Embodiment 1 (namely, a gate electrode including a barrier film of a titanium film and a titanium nitride film formed on a p-type polysilicon film (expressed as PPS)) is plotted with ☆, the relationship obtained in a gate electrode of the first conventional example (namely, a gate electrode including a barrier film of a tungsten nitride film formed on an n-type polysilicon film) is plotted with ●, the relationship obtained in another gate electrode of the first conventional example (namely, a gate electrode including a barrier film of a tungsten nitride film formed on a p-type polysilicon film) is plotted with ○, the relationship obtained in a gate electrode of the second conventional example (namely, a gate electrode including a barrier film of a titanium nitride film formed on an n-type polysilicon film) is plotted with ◆, and the relationship obtained in another gate electrode of the second conventional example (namely, a gate electrode including a barrier film of a titanium nitride film formed on a p-type polysilicon film) is plotted with ◇. In FIG. 3, since the contact between the films is non-ohmic when the interface resistance $R_c$ exceeds 500 $\Omega\mu m^2$, the interface resistance is shown as a resistance value obtained by allowing a current of 1 mA/$\mu m^2$ to flow.

As is understood from FIG. 3, in the gate electrode of Embodiment 1, the interface resistance is not increased even when the annealing temperature is as high as approximately 900° C., which is required for forming a transistor, and thus, a very satisfactory result is obtained. Also, as is understood from FIG. 3, a difference in the interface resistance starts to appear between the electrode structures of Embodiment 1 and the first conventional example in the annealing carried out at 750° C., the difference in the interface resistance between the electrode structures of Embodiment 1 and the first conventional example becomes large in the annealing carried out at 850° C., and the difference in the interface resistance between the electrode structures of Embodiment 1 and the first conventional example becomes larger beyond comparison in the annealing carried out at 900° C. or more.

FIGS. 4A through 4E show change of the thickness of the reaction layer 19 obtained after the annealing with the thickness of the titanium film 14 changed in the method for fabricating an electrode structure of Embodiment 1, and are cross-sectional views for schematically illustrating TEM photographs. In this case, the annealing is carried out at 1000° C. for 30 seconds.

Figure 4A:
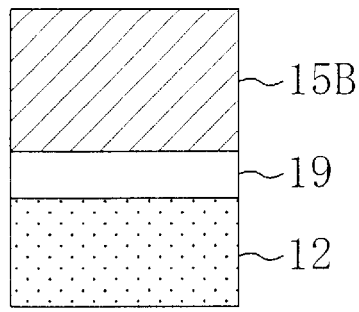
FIGS. 4A, 4B, 4C, 4D and 4E are cross-sectional views for showing change in the thickness of a reaction layer obtained after annealing with the thickness of a titanium film varied in the method for fabricating an electrode structure of Embodiment 1.
Figure 4B:
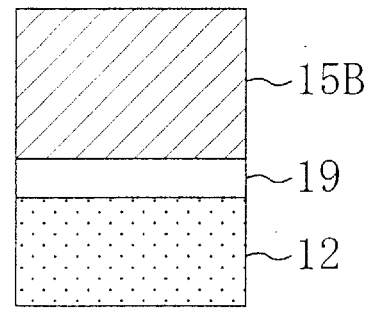
Figure 4C:
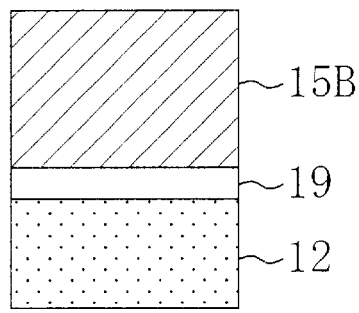
Figure 4D:
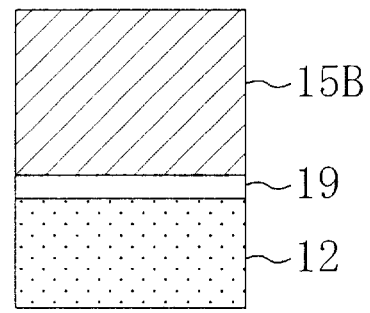
Figure 4E:
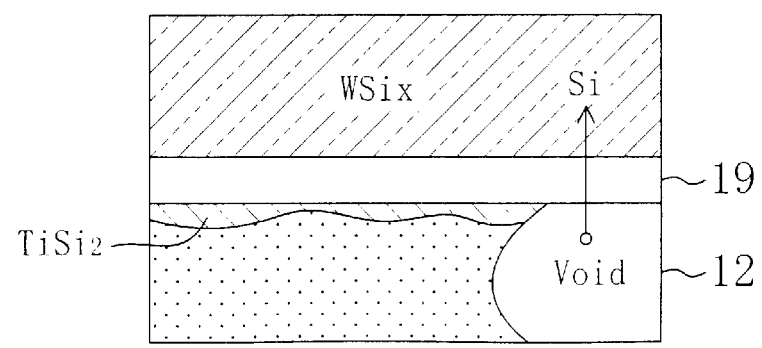

The titanium film has a thickness of 0 nm in FIG. 4A, a thickness of 2.5 nm in FIG. 4B, a thickness of 3.5 nm in FIG. 4C, a thickness of 4.5 nm in FIG. 4D and a thickness of 10.0 nm in FIG. 4E.

As is understood also from FIGS. 4A through 4D, the thickness of the reaction layer 19 of silicon nitride is reduced in accordance with the increase of the thickness of the titanium film. In particular, when the titanium film has a thickness of 4.5 nm, the thickness of the reaction layer 19 is smaller than 1 nm, so that the interface resistance can be largely lowered.

Also, as is understood from FIG. 4E, when the titanium film has a thickness of 10.0 nm, silicon atoms included in the polysilicon film are diffused through the titanium nitride film to reach the tungsten film during the annealing, so as to form a tungsten silicide ($WSi_x$) layer. The mechanism for forming the tungsten silicide layer is as follows: Since the titanium film has a large thickness, titanium atoms of the titanium film and silicon atoms of the polysilicon film are reacted with each other before the annealing so as to form a titanium silicide ($TiSi_2$) layer. This is because annealing is carried out at 650 through 750° C. in depositing the hard mask (SiN film) or the sidewall (SiN film) so as to form the titanium silicide layer. The titanium silicide layer is agglomerated through the subsequent annealing at high temperature like that for activating the source and the drain, and a gap is formed in the titanium nitride film. Therefore, silicon of the polysilicon film is probably diffused through the gap of the titanium nitride film to reach the tungsten film (See J. Appl. Phys. 62(4), Aug. 15, 1987, p. 1265). When such a phenomenon occurs, voids are formed in portions of the polysilicon film from which the silicon atoms are diffused, resulting in causing peeling between the polysilicon film and the tungsten film. Accordingly, the thickness of the titanium film should be 8 nm or less.

Embodiment 2

A method for fabricating a semiconductor device according to Embodiment 2 of the invention will now be described with reference to FIGS. 5A through 5C, 6A and 6B.

Figure 5A:
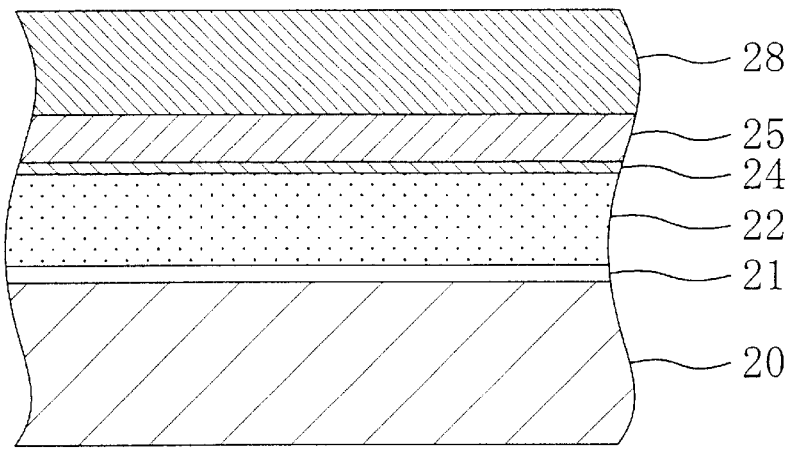
FIGS. 5A, 5B and 5C are cross-sectional views for showing procedures in a method for fabricating a semiconductor device according to Embodiment 2 of the invention.

First, as shown in FIG. 5A, a silicon oxide film 21 serving as a gate insulating film is formed on a semiconductor substrate 20, and a polysilicon film 22 is deposited on the silicon oxide film 21.

Next, a titanium film 24 and a titanium nitride film 25 together serving as a barrier film are successively formed on the polysilicon film 22 and a tungsten film 28 is deposited on the titanium nitride film 25 in the same manner as in Embodiment 1, thereby forming a multi-layer structure of the polysilicon film 22, the titanium film 24, the titanium nitride film 25 and the tungsten film 28.

Figure 5B:
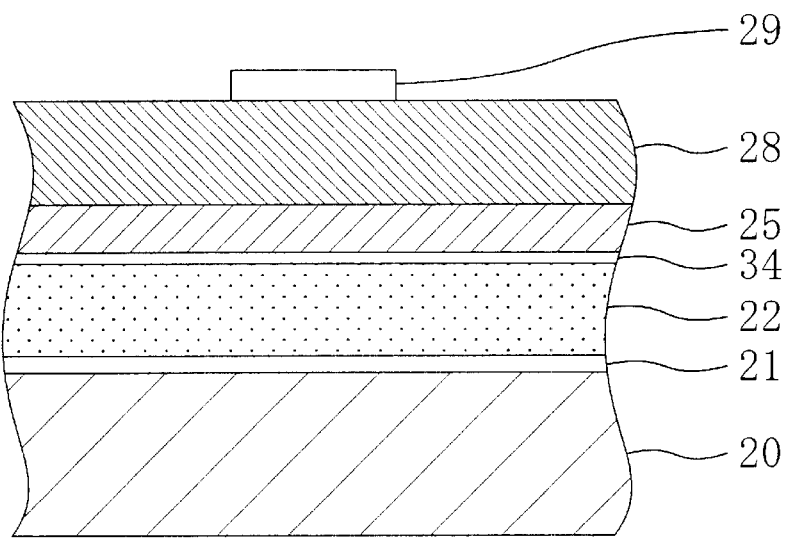

Next, as shown in FIG. 5B, a hard mask 29 of a silicon nitride film for forming a gate electrode is formed on the multi-layer structure. In this case, the silicon nitride film is deposited at a temperature of approximately 750° C., and excessive nitrogen included in the titanium nitride film 25 is diffused into the titanium film 24 during this annealing, so as to change the titanium film 24 into a titanium nitride film. In the case where the titanium nitride film 25 includes a large amount of excessive nitrogen, a reaction layer 34 including silicon and nitrogen as principal constituents is formed between the polysilicon film 22 and the titanium nitride film 25 as shown in FIG. 5B.

Figure 5C:
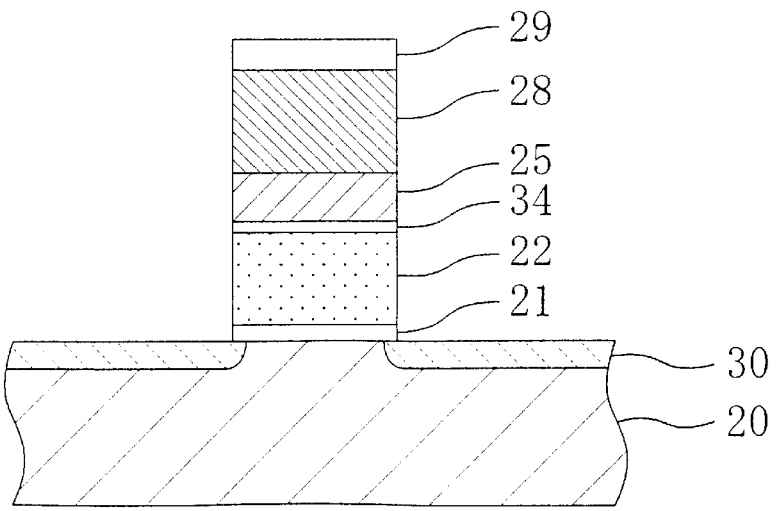

Then, as shown in FIG. 5C, the multi-layer structure is etched by using the hard mask 29, so as to form a gate electrode from the multi-layer structure, and the gate electrode is cleaned. In this case, since the tungsten film 28 is used as the upper film of the gate electrode, a cleaning solution not eluting tungsten is used for the cleaning. The cleaning solution is preferably diluted hydrofluoric acid (HF), and hydrogen peroxide, which elutes tungsten, is not preferred.

A titanium silicide ($TiSi_2$) layer has a property to dissolve in diluted hydrofluoric acid. Therefore, if a titanium silicide layer is formed between the polysilicon film 22 and the titanium nitride film 25, side etching is caused in a region between the polysilicon film 22 and the titanium nitride film 25. In Embodiment 2, however, although the cleaning is conducted by using diluted hydrofluoric acid, side etching is not caused in the region between the polysilicon film 22 and the titanium nitride film 25. It can be confirmed, on the basis of this fact, that the titanium film 24 is entirely changed into the titanium nitride film with no titanium silicide layer formed between the polysilicon film 22 and the titanium nitride film 25.

Figure 6A:
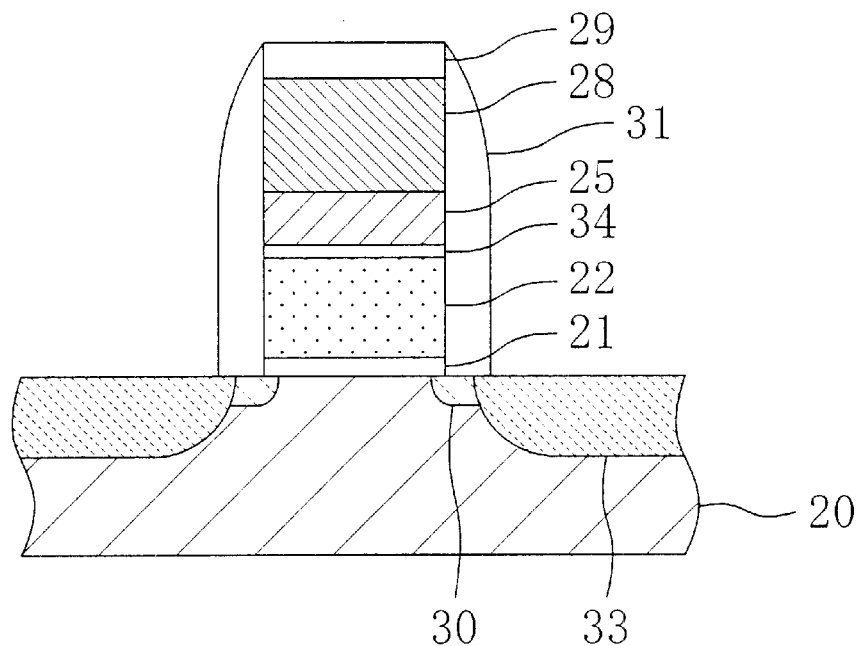
FIGS. 6A and 6B are cross-sectional views for showing other procedures in the method for fabricating a semiconductor device of Embodiment 2.
Figure 6B:
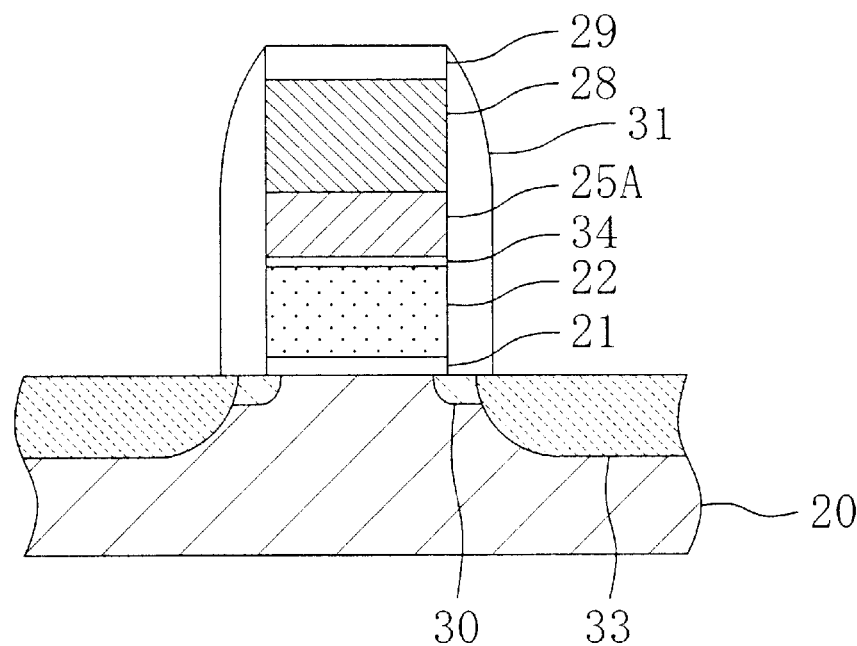

Next, the semiconductor substrate 20 is doped with a dopant by using the gate electrode as a mask, thereby forming lightly-doped layers 30. Thereafter, a silicon nitride film is deposited over the semiconductor substrate 20 at a temperature of 750° C., and the silicon nitride film is subjected to anisotropic etching. Thus, a sidewall 31 is formed on the side face of the gate electrode as shown in FIG. 6A. Then, the semiconductor substrate 20 is doped with a dopant by using the gate electrode and the sidewall as a mask, thereby forming heavily-doped layers 33.

Subsequently, the semiconductor substrate 20 is subjected to annealing at 750° C. or more, thereby activating the lightly-doped layers 30 and the heavily-doped layers 33 serving as the source and the drain. Before carrying out the annealing at 750° C. or more for activating the dopant layers serving as the source and the drain, excessive nitrogen included in the titanium nitride film 25 is almost lost. Therefore, the reaction layer 34 formed between the polysilicon film 22 and the titanium nitride film 25 is minimally elongated even though the annealing is carried out at 750° C. or more.

Figure 7A:
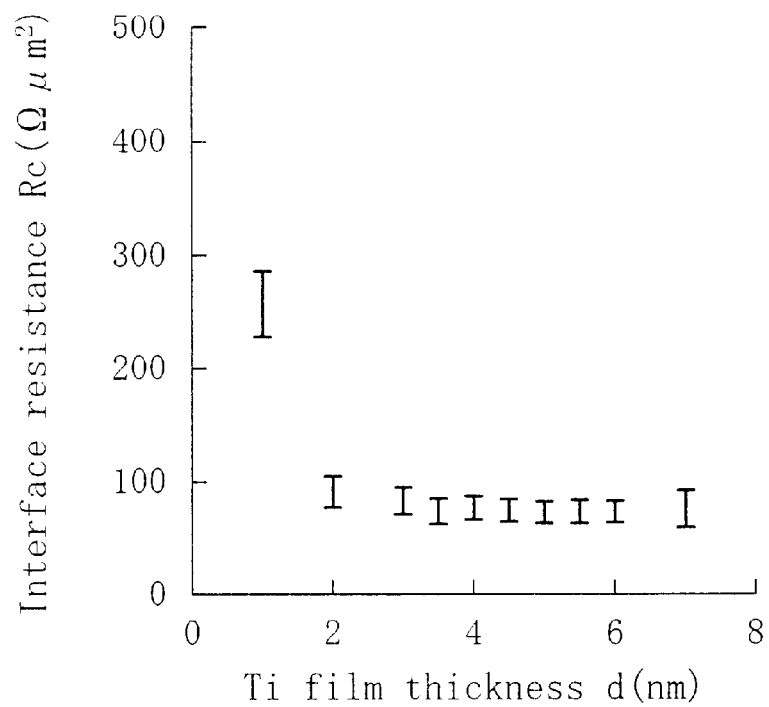
FIGS. 7A and 7B are diagrams for showing the relationship between the thickness of a titanium film and interface resistance obtained after annealing in the method for fabricating a semiconductor device of Embodiment 2.
Figure 7B:
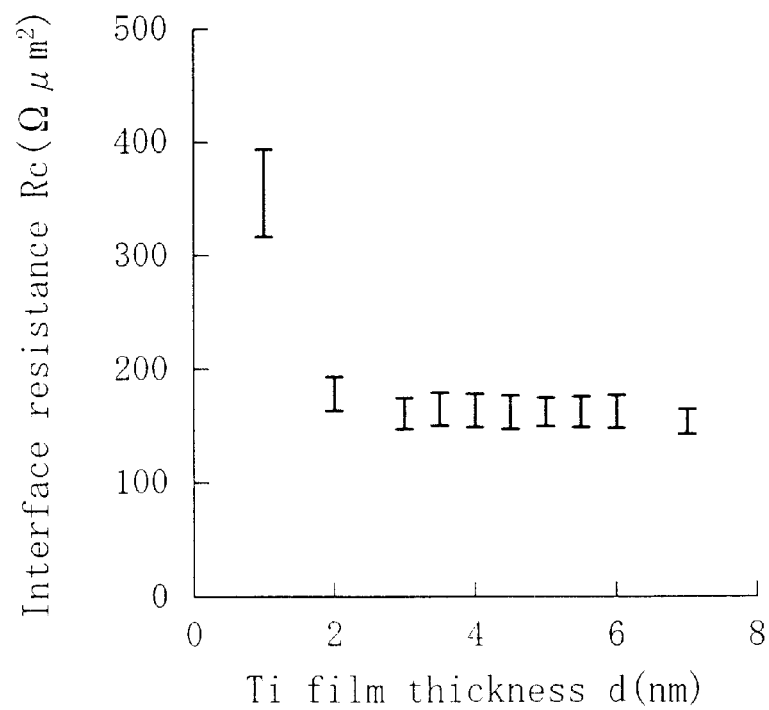
Figure 8A:
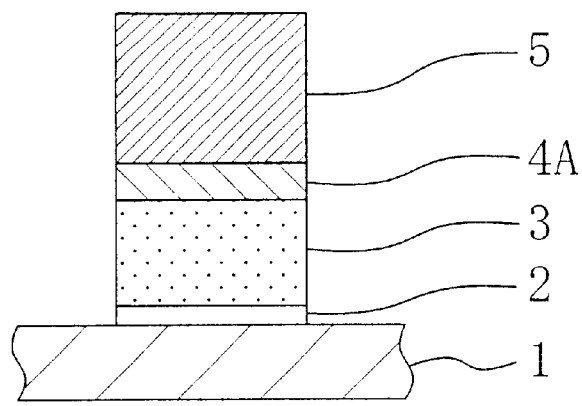
FIG. 8A is a cross-sectional view of the electrode structure of the first conventional example.
Figure 8B:
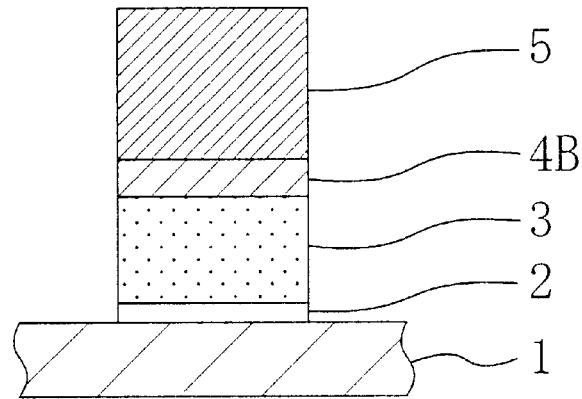
FIG. 8B is a cross-sectional view of the electrode structure of the second conventional example and FIG. 8C is a cross-sectional view of the electrode structure of the first conventional example obtained after carrying out annealing at 750° C. or more.
Figure 8C:
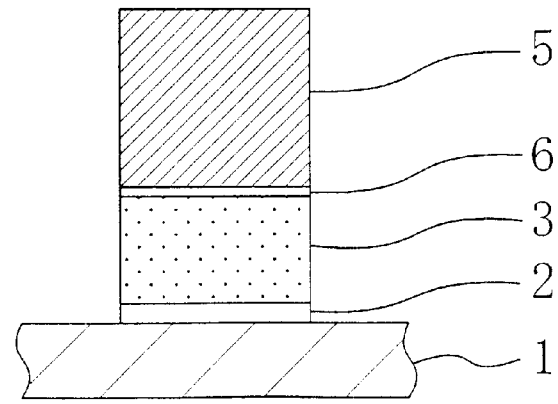
Figure 9A:
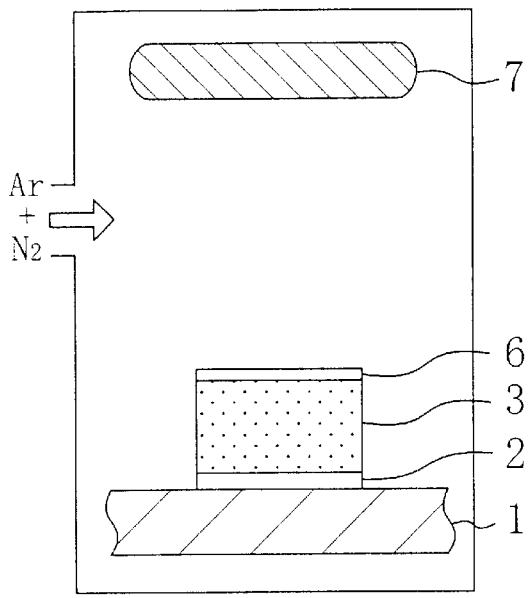
FIGS. 9A, 9B and 9C are cross-sectional views for showing procedures in a method for fabricating the electrode structure of the second conventional example.
Figure 9B:
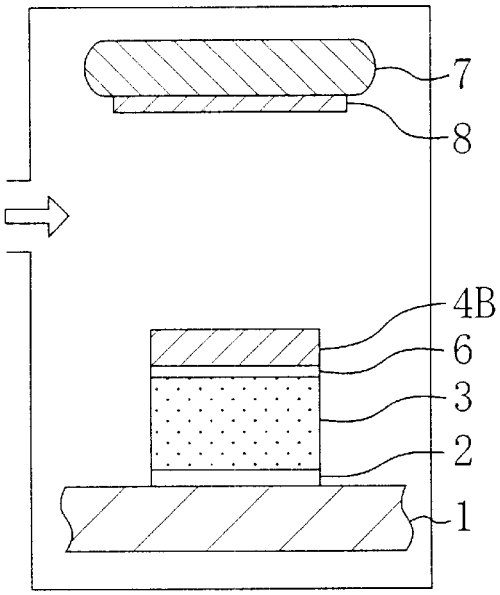
Figure 9C:
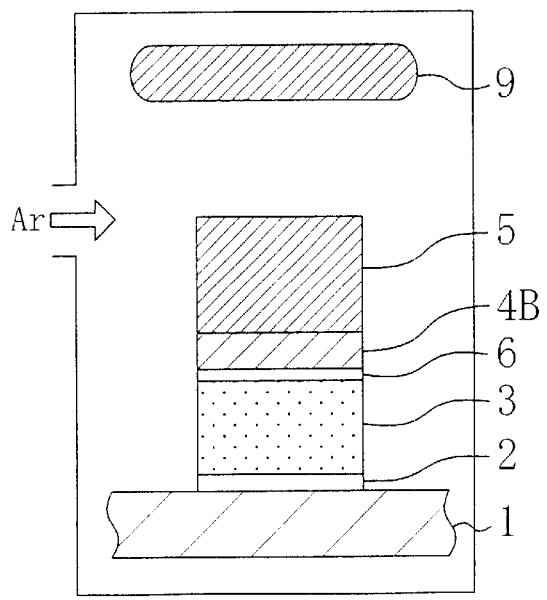
Figure 10A:
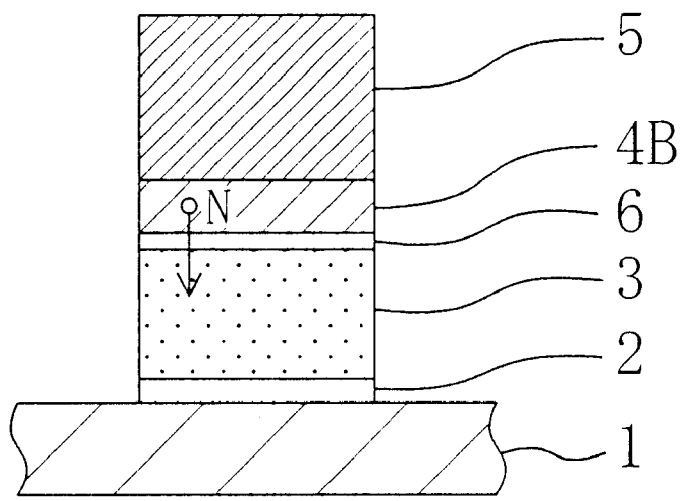
FIGS. 10A and 10B are cross-sectional views for illustrating a problem of the method for fabricating the electrode structure of the second conventional example.
Figure 10B:
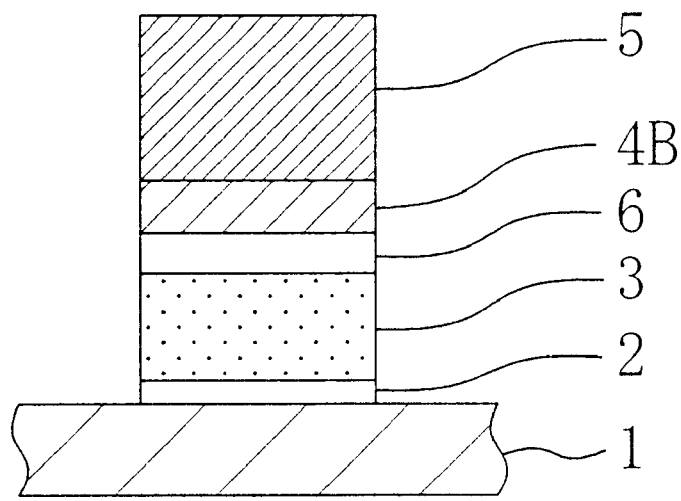
Figure 11:
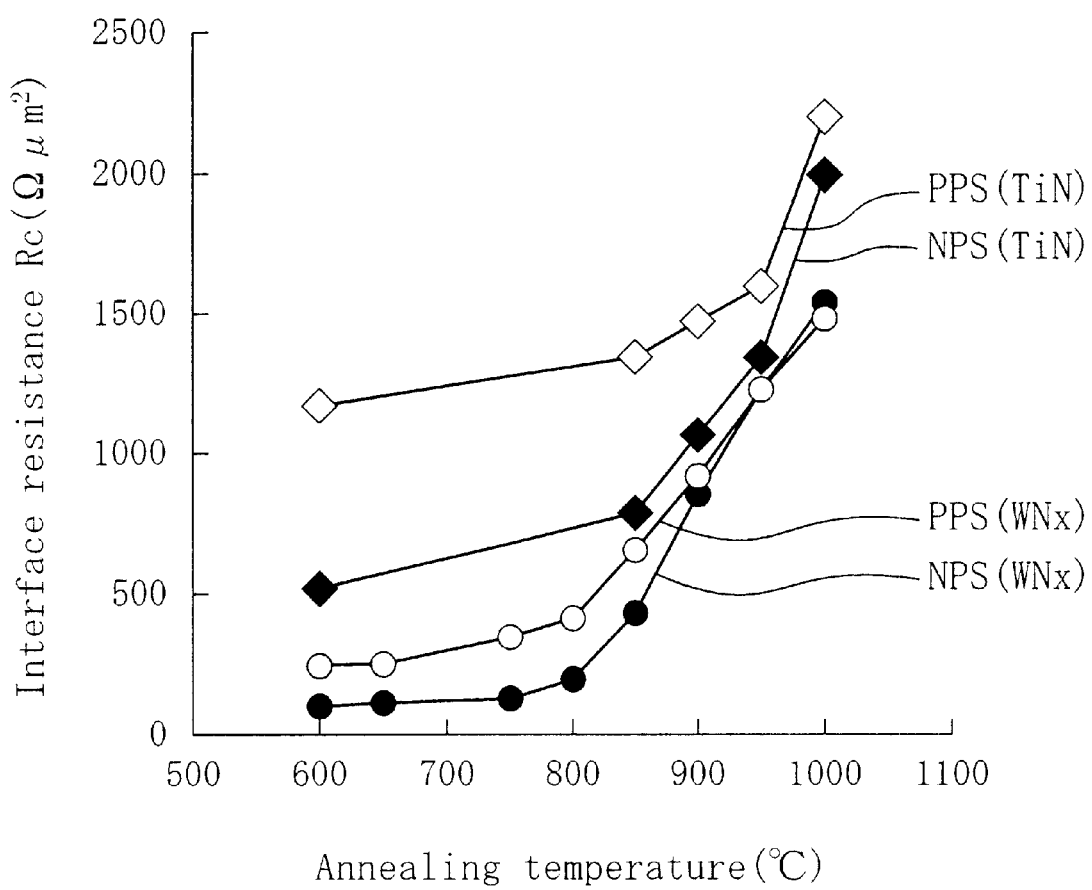
FIG. 11 is a graph for showing the relationship between the annealing temperature and interface resistance obtained after annealing carried out on a gate electrode composed of the electrode structure of the first or second conventional example.

FIGS. 7A and 7B show the relationship between the thickness d of the titanium film 24 and the interface resistance $R_c$ between the polysilicon film 22 and the metal film 28 with a high melting point obtained after the annealing in the method for fabricating a semiconductor device of Embodiment 2, in which the titanium nitride film 25 with a thickness of 10 nm and the tungsten film 28 with a thickness of 40 nm are deposited on the titanium film 24. Also, the annealing is carried out at 750° C. in depositing the titanium nitride film serving as the hard mask 29 and at 975° C. for 30 seconds in activating the lightly-doped layers 30 and the heavily-doped layers 33 serving as the source and the drain. FIG. 7A shows the relationship obtained when the polysilicon film 22 has the n-type conductivity and FIG. 7B shows that obtained when the polysilicon film 22 has the p-type conductivity.

As is understood from FIGS. 7A and 7B, when the titanium film 24 has a thickness of 2 nm or more, the interface resistance can be lowered to 200 $\Omega\mu m^2$ or less and the ohmic characteristic can be attained.

When the titanium film 24 has a thickness of 1 nm, although the ohmic characteristic can be attained, the interface resistance is slightly higher. This is because the thickness of the titanium film 24 is small and hence the thickness of the reaction layer 34 of silicon nitride is slightly large.

As a comparative example, a gate electrode is fabricated under the same conditions as in Embodiment 2 except that the titanium film 24 is not formed. The interface resistance of this gate electrode is 1488 $\Omega\mu m^2$ when the polysilicon film 22 has the n-type conductivity and is 1689 $\Omega\mu m^2$ when the polysilicon film 22 has the p-type conductivity, and the ohmic characteristic cannot be attained.

In Embodiment 2, a titanium silicide layer is not formed and the interface resistance can be lowered even after the annealing at 750° C. or more, and therefore, the lowering of the operation speed of the MOS transistor can be prevented. Also, peeling of the tungsten film 28 derived from the formation of a titanium silicide layer can be avoided.

Although a tungsten film is used as the metal film with a high melting point in Embodiments 1 and 2, a molybdenum (Mo) film, a tungsten silicide ($WSi_x$) film or molybdenum silicide ($MoSi_2$) film may be used instead.

Although a titanium nitride film is used as the upper film of the barrier film, another metal nitride film such as a tantalum nitride (TaN) film or a tungsten nitride (WN) film may be used instead.

Although a titanium film is used as the lower film of the barrier film, a metal film capable of forming a nitride, such as a tantalum (Ta) film and a tungsten (W) film, may be used instead.

The metals (such as Ti, Ta and W) included in the upper and lower films of the barrier film may be the same or different. The same metal is preferably used because the upper and lower films of the barrier film can be continuously formed by using the same target with merely an introduced gas changed.

Also, an SOI substrate may be used instead of the silicon substrate.

What is claimed is:

1. A method for fabricating an electrode structure comprising the steps of:

(a) depositing a first metal film of a first metal on a silicon-containing film containing silicon as a principal constituent;

(b) depositing a second metal film of a nitride of a second metal on said first metal film;

(c) depositing a metal film with a high melting point on said second metal film, whereby forming a multi-layer film of said silicon containing film, said first metal film, said second metal film and said metal film with a high melting point;

(d) depositing an insulating film on said multi-layer film; and (e) after step (d), carrying out annealing on said multi-layer film at a temperature of 750° or more, wherein in the step (d), said first metal is nitrided to be changed into a nitride of said first metal by diffusing the nitrogen in said second metal film into said first metal film.

2. The method for fabricating an electrode structure of claim 1, wherein no silicon nitride film or a silicon nitride film with a thickness of 1.5 nm or less is formed between said silicon-containing film and said first metal film as a result of the annealing.

3. The method for fabricating an electrode structure of claim 1, wherein interface resistance between said silicon-containing film and said metal film with a high melting point is 300 $\Omega\mu m^2$ or less after the annealing.

4. The method for fabricating an electrode structure of claim 1, wherein said first metal and said second metal are the same metal, said first metal film is deposited through sputtering carried out by using a target including said same metal, and said second metal film is deposited by sputtering a nitride film of said same metal formed in a surface portion of said target.

5. The method for fabricating an electrode structure of claim 1, wherein said first metal and said second metal are both titanium.

6. The method for fabricating an electrode structure of claim 1, wherein the nitride of said second metal is titanium nitride, tungsten nitride, tantalum nitride or tungsten silicide nitride.

7. A method for fabricating a semiconductor device comprising the steps of:

(a) depositing a polysilicon film on a semiconductor region;

(b) depositing a first metal film of a first metal on said polysilicon film;

(c) depositing a second metal film of a nitride of a second metal on said first metal film;

(d) depositing a metal film with a high melting point on said second metal film, whereby forming a multi-layer film including said polysilicon film, said first metal film, said second metal film and said metal film with a high melting point;

(e) depositing an insulating film that functions as a hard mask on said multi-layer film;

(f) forming a gate electrode from said multi-layer film by etching said multi-layer film using said hard mask;

(g) forming a dopant layers serving as a source and a drain by ion implanting a dopant with said gate electrode used as a mask; and (h) activating said dopant layers by carring out annealing at a temperature of 750° or more, wherein in step (e), said first metal is nitrided to be changed into a nitride of said first metal by diffusing the nitrogen in said second metal film into said first metal film.

8. The method for fabricating a semiconductor device of claim 7, wherein no silicon nitride film or a silicon nitride film with a thickness of 1.5 nm or less is formed between said polysilicon film and said first metal film as a result of the annealing.

9. The method for fabricating a semiconductor device of claim 7, wherein said first metal and said second metal are both titanium.

10. The method for fabricating an electrode structure of claim 1, wherein said insulating film functions as a hard mask or a sidewall of said multi-layer film.

11. The method for fabricating an electrode structure of claim 1, wherein in the step (d), the temperature during the deposition of said insulating film is between and inclusive of 650° and 750°.

12. The method of fabricating a semiconductor device of claim 7, wherein in the step (e), the temperature during the deposition of said insulating film is between and inclusive of 650° and 750°.

* * * * *